US012690162B2

(12) United States Patent
Lee et al.

(10) Patent No.: US 12,690,162 B2
(45) Date of Patent: Jul. 21, 2026

(54) SINGLE PHASE LIQUID IMMERSION COOLING SYSTEM WITH FORCED COOLING CIRCUIT

(71) Applicants: Fang-Shou Lee, Taoyuan (TW);
Cho-Han Lee, Taoyuan (TW)

(72) Inventors: Fang-Shou Lee, Taoyuan (TW);
Cho-Han Lee, Taoyuan (TW); Fang
Wang, Livermore, CA (US)

( * ) Notice: Subject to any disclaimer, the term of this
patent is extended or adjusted under 35
U.S.C. 154(b) by 203 days.

(21) Appl. No.: 18/383,022

(22) Filed: Oct. 23, 2023

(65) Prior Publication Data

US 2025/0107036 A1 Mar. 27, 2025

(30) Foreign Application Priority Data

Sep. 25, 2023 (TW) ................................. 112136508

(51) Int. Cl.
*H05K 7/20* (2006.01)

(52) U.S. Cl.
CPC ..... *H05K 7/20236* (2013.01); *H05K 7/20254*
(2013.01); *H05K 7/20263* (2013.01); *H05K
7/20272* (2013.01)

(58) Field of Classification Search
CPC .......... H05K 7/20236; H05K 7/20272; H05K
7/20263; H05K 7/203; H05K 7/20254;
H05K 7/20327; H05K 7/20281; H05K
7/20763; H05K 5/067; H05K 7/20218;
H05K 7/208; H05K 7/20927; G06F
2200/201; G06F 1/20; G06F 1/206; H01L
23/473; H01L 23/44

USPC .......... 165/104.33, 80.4; 62/259.2; 361/699,
361/679.53, 698, 702
See application file for complete search history.

(56) References Cited

U.S. PATENT DOCUMENTS

| | | | |
|---|---|---|---|
| 7,905,106 B2 | 3/2011 | Attlesey | |
| 7,911,793 B2 | 3/2011 | Attlesey | |
| 8,089,764 B2 | 1/2012 | Attlesey | |
| 9,451,726 B2 | 9/2016 | Regimbal et al. | |
| 10,390,458 B2 | 8/2019 | Tufty et al. | |
| 2022/0322562 A1* | 10/2022 | Chehade | H05K 7/20236 |
| 2023/0084765 A1* | 3/2023 | Gao | H05K 7/20254 |
| | | | 361/679.53 |
| 2025/0008690 A1* | 1/2025 | Bean, Jr. | H05K 7/20781 |

* cited by examiner

*Primary Examiner* — Mandeep S Buttar

(57) ABSTRACT

Disclosed is a single phase liquid immersion cooling system
with a forced cooling circuit for cooling heat-generating
electronic devices, such as servers. The cooling system
comprises an immersion cooling unit, a heat exchanger, a
first dielectric fluid circulating unit and a second dielectric
fluid circulating unit. The immersion cooling unit includes a
tank within which dielectric fluid and heat-generating elec-
tronic devices are maintained. The heat-generating elec-
tronic devices are provided with a radiator and submerged in
the body of dielectric fluid. The first dielectric fluid circu-
lating unit includes a first fluid inlet pipe interconnecting the
heat exchanger and the tank, a first fluid outlet pipe inter-
connecting the heat exchanger and the tank, and a first motor
pump disposed on the first fluid outlet pipe. The second
dielectric fluid circulating unit includes a manifold, a second
fluid outlet pipe interconnecting the manifold and the tank,
a second fluid inlet pipe interconnecting the manifold and
the radiator, and a second motor pump disposed on the
second fluid outlet pipe.

5 Claims, 4 Drawing Sheets

1000

SINGLE PHASE LIQUID IMMERSION COOLING SYSTEM WITH FORCED COOLING CIRCUIT

CROSS-REFERENCE TO RELATED APPLICATION

This application claims priority to an earlier Taiwan patent application Ser. No. 112136508, filed Sep. 25, 2023, which is incorporated herein by reference in its entirety.

BACKGROUND OF THE INVENTION

Field of Invention

The present disclosure relates to a single phase liquid immersion cooling system, and more particularly to a single phase liquid immersion cooling system with a forced cooling circuit.

Description of the Related Art

With the advent of the data era, people are seeking for higher technology and to push its performance to the limit. Along with that, heat-dissipation for high performance computing (HPC) used by data centers is highly coveted. In recent years, aside of conventional air cooling technique, liquid immersion cooling system is also born for effectively cooling down electronic(s) that generates undesirable heat.

Single phase liquid immersion cooling electronic systems are known in the art. Liquid submerged server (LSS) arrays applied on a server rack are a practical example. Other examples of LSS arrays in a server rack system are disclosed in U.S. Pat. Nos. 7,905,106, 7,911,793, 8,089,764 and 9,451,726.

As shown in FIG. 1, in a conventional single phase liquid immersion cooling system 1000, a plurality of heat-generating electronic devices 230 (e.g. servers that generate undesirable heat during operation) is directly immersed into dielectric fluid maintained within a tank 210. One or more heat-generating electronic components (e.g. central processing unit, CPU) are mounted on each of the heat-generating electronic devices 230, wherein the heat-generating electronic component(s) is provided with radiators 231, such that the undesirable heat generated from the heat-generating electronic devices 230 is transferred into the dielectric fluid. After absorbing the heat, the dielectric fluid remains in liquid phase (no phase transition occurs). Therefore, a motor pump 60 is commonly used to force the heated dielectric fluid out of the tank 210, sequentially into a first fluid outlet pipe 420, through a heat exchanger 300 and into a first fluid inlet pipe 410, thereby sending the dielectric fluid cooled by the heat exchanger 300 back to the tank 210.

Generally, as for different types of electronic components (e.g. CPU, random access memory (RAM) or hard disk drive (HDD), etc.) mounted on a heat-generating electronic device, they generate heat at different rates during their operation, wherein CPU is commonly a main source of the undesirable heat. However, the conventional single phase liquid immersion cooling system is unable to perform a particular cooling treatment to the main source of heat; therefore, overall cooling performance thereof is poor, especially when multiple heat-generating electronic devices operate simultaneously.

Therefore, there is a need for a novel single phase liquid immersion cooling system with a forced cooling circuit that particularly focuses on cooling the main source of undesirable heat, thereby improving the overall cooling performance of the single phase liquid immersion cooling system and guaranteeing the smooth operation of the heat-generating electronic device(s).

BRIEF SUMMARY OF THE INVENTION

It's an object of the present disclosure to provide a single phase liquid immersion cooling system with a forced cooling circuit where an active cooling circulating unit is additionally disposed in a single phase liquid immersion cooling system. The active cooling circulating unit is able to focus mainly on cooling the abovementioned electronic component(s) (e.g. CPU) which is regarded as main source of undesirable heat on the heat-generating electronic device(s) (e.g. server), thereby greatly improving the overall cooling performance in the single phase liquid immersion cooling system.

In order to attain the aforesaid object, in one embodiment of the present disclosure, a single phase liquid immersion cooling system with forced cooling circuit is provided. The single phase liquid immersion cooling system is provided for cooling at least one heat-generating electronic device, and includes an immersion cooling unit, a heat exchanger, a first dielectric fluid-circulating unit, and a second dielectric fluid-circulating unit.

The immersion cooling unit including a tank that defines a fluid-tight space therein, wherein the fluid-tight space is provided with dielectric fluid. The heat-generating electronic device is disposed within the fluid-tight space and at least partially immersed within the dielectric fluid. Furthermore, the heat-generating electronic device is provided with at least one radiator.

The first dielectric fluid-circulating unit includes a first fluid inlet pipe, a first fluid outlet pipe, and at least one first motor pump. The first fluid inlet pipe interconnects the heat exchanger and the tank, for guiding the dielectric fluid cooled by the heat exchanger into the tank. The first fluid outlet pipe interconnects the heat exchanger and the tank, for guiding the dielectric fluid flowing through the at least one heat-generating electronic device into the heat exchanger so as to cool the dielectric fluid. The first motor pump is disposed on the first fluid outlet pipe.

The second dielectric fluid-circulating unit includes a manifold, a second fluid outlet pipe, at least one second fluid inlet pipe, and at least one second motor pump. The second fluid outlet pipe interconnects the manifold and the tank, for guiding the dielectric fluid cooled by the heat exchanger out of the tank into the manifold. The second fluid inlet pipe interconnects the manifold and the radiator, for guiding the dielectric fluid from the manifold into the radiator. Furthermore, the second motor pump is disposed on the second fluid outlet pipe.

In one embodiment of the present disclosure, the radiator is a finned cooler or a cold plate.

In one embodiment of the present disclosure, the heat exchanger is a plate heat exchanger.

In one embodiment of the present disclosure, the manifold is disposed on an inner upper-lateral wall of the tank, and above the heat-generating electronic device. The manifold is provided with at least one opening that is positioned in correspondence with the heat-generating electronic device.

In one embodiment of the present disclosure, the immersion cooling unit further includes a guide board which is provided with a plurality of through holes. Also, the guide board is disposed between an inner-bottom surface of the tank and the heat-generating electronic device.

In one embodiment of the present disclosure, the first fluid inlet pipe has an end connected to a lower-lateral wall of the tank, and positioned between the inner-bottom surface of the tank and the guide board. Furthermore, the first fluid outlet pipe has an end connected to an upper-lateral wall of the tank, and positioned beneath a liquid level of the dielectric fluid.

In one embodiment of the present disclosure, the second fluid outlet pipe has an end connected to the lower-lateral wall of the tank, and positioned between the inner-bottom-surface of the tank and the guide board.

As described above, according to the single phase liquid immersion cooling system with forced cooling circuit disclosed in the present application, an active cooling circulating unit is additionally disposed in the single phase liquid immersion cooling system, wherein the active cooling circulating unit includes a second motor pump that is able to force relatively low-temperature dielectric fluid to flow at a specific flow rate sequentially through the second fluid outlet pipe, the manifold, the second fluid inlet pipe, and then finally into the radiator disposed on the main heat-generating electronic component(s) of the heat-generating electronic device. Therefore, the active cooling circulating unit is able to greatly improve the overall cooling performance in the single phase liquid immersion cooling system.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION OF THE INVENTION

Figure 1:
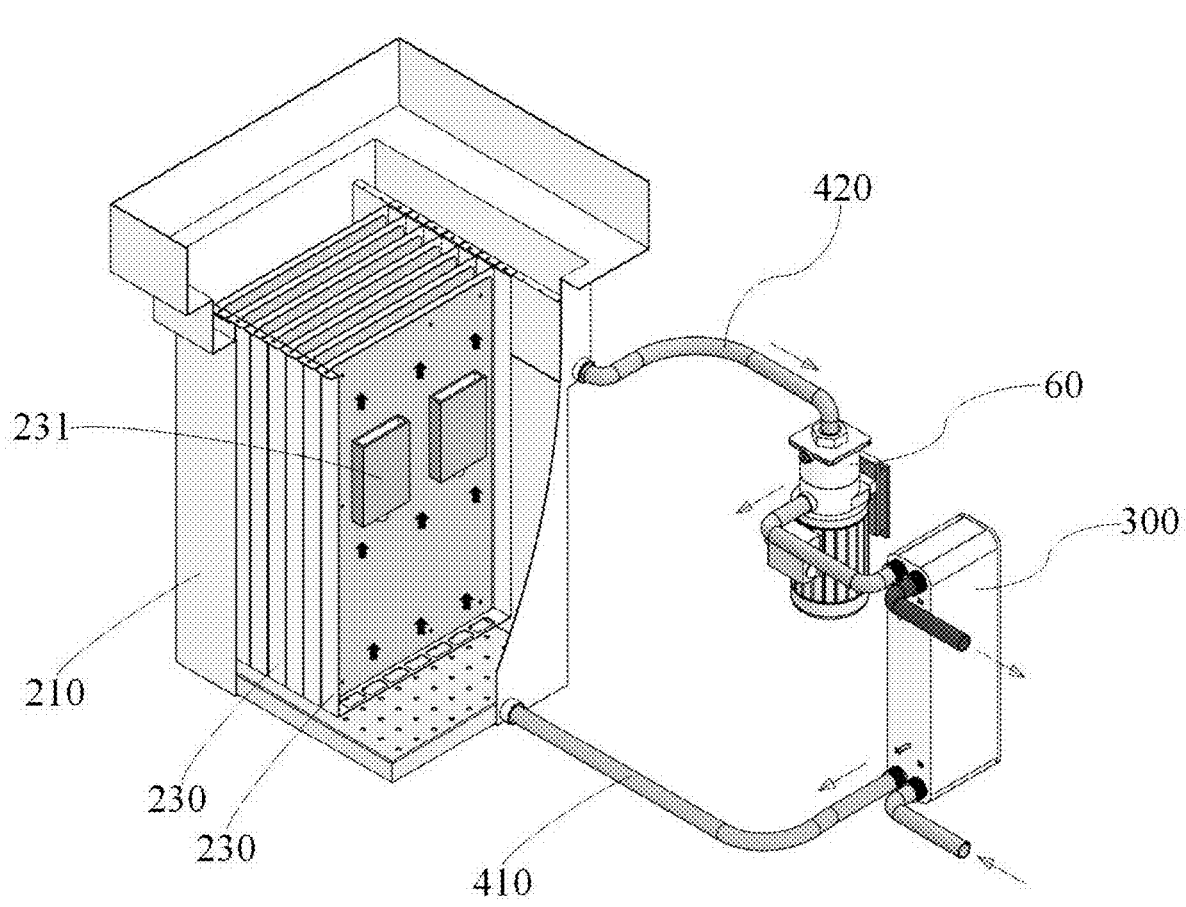
FIG. 1 is a schematic perspective view of a conventional single phase liquid immersion cooling system according to prior art.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not for other embodiments.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Moreover, the use of the terms first, second, etc. do not denote any order or importance, but rather the terms first, second, etc. are used to distinguish one element from another.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

Within the descriptions of the different views of the figures, the use of the same reference numerals and/or symbols in different drawings indicates similar or identical items, and similar elements can be provided similar names and reference numerals throughout the figure(s). The specific identifiers/names and reference numerals assigned to the elements are provided solely to aid in the description and are not meant to imply any limitations (structural or functional or otherwise) on the described embodiments. In the illustration of the various embodiments, two different figures can be provided that have overlaps and/or similarities in the components within the two figures (e.g., FIGS. 1 and 3). In such instances, the descriptions of these figures can be presented together with associated similar reference numerals separated by commas and/or a slash. Some components that are not expected to be different from one implementation to the other are provided the same reference numerals within the figures, to simplify the descriptions of the figures.

Those of ordinary skill in the art will appreciate that the hardware components and basic configuration depicted in any of the figures illustrated by the drawings and described herein may vary. For example, the illustrative components within an immersion cooling unit (FIG. 3) and other devices and systems are not intended to be exhaustive, but rather be representative of and highlight components that can be utilized to implement aspects of the present disclosure. For example, other devices/components may be used in addition to or in place of the hardware depicted. The depicted examples do not convey or imply any architectural or other limitations with respect to the presently described embodiments and/or the general disclosure.

It's an object of the present disclosure to provide a single phase liquid immersion cooling system with a forced cooling circuit where an active cooling circulating unit is additionally disposed in a single phase liquid immersion cooling system. The active cooling circulating unit is able to focus mainly on cooling the abovementioned electronic component(s) (e.g. CPU) which is regarded as main source of undesirable heat on the heat-generating electronic device(s) (e.g. server), thereby greatly improving the overall cooling performance in the single phase liquid immersion cooling system.

Figure 2:
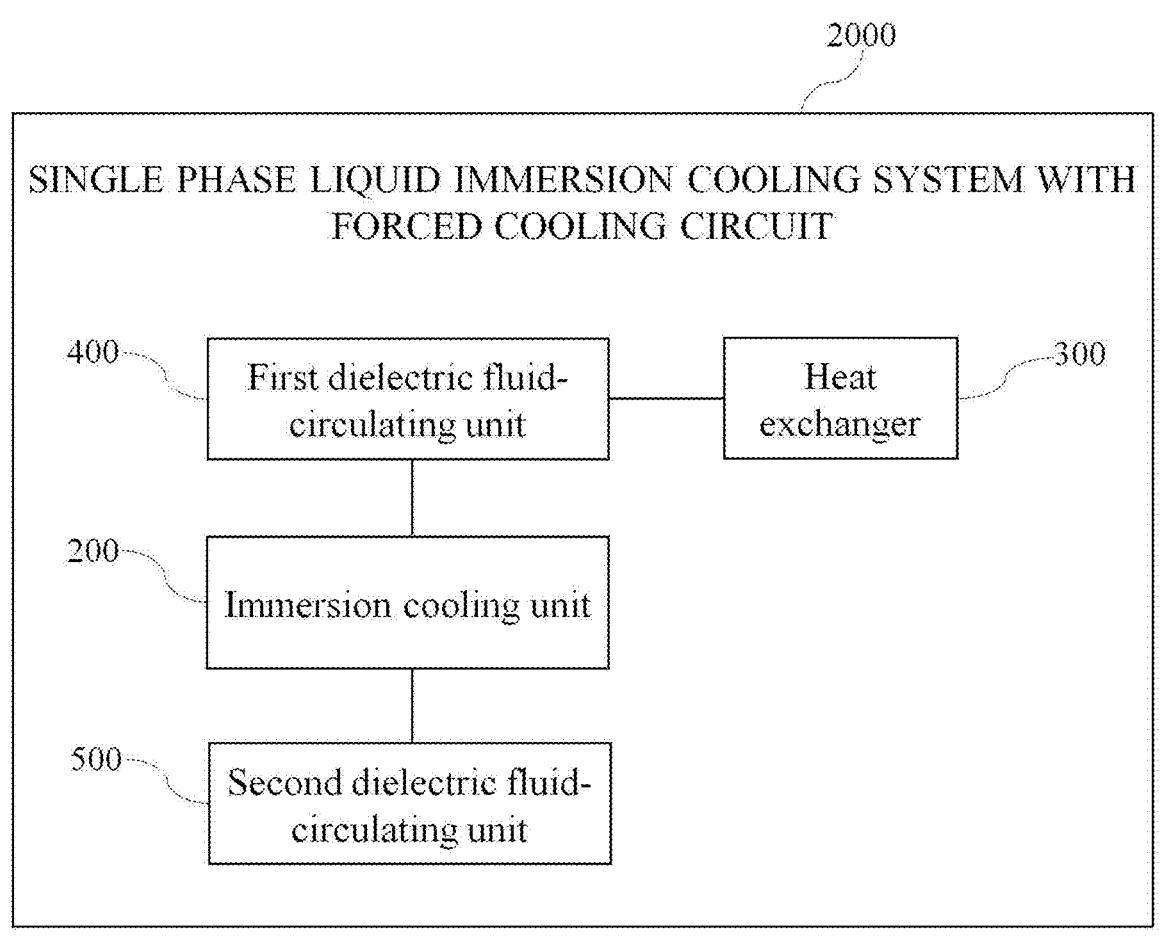
FIG. 2 is a block diagram of a single phase liquid immersion cooling system with forced cooling circuit, according to one embodiment of the present disclosure.
Figure 3:
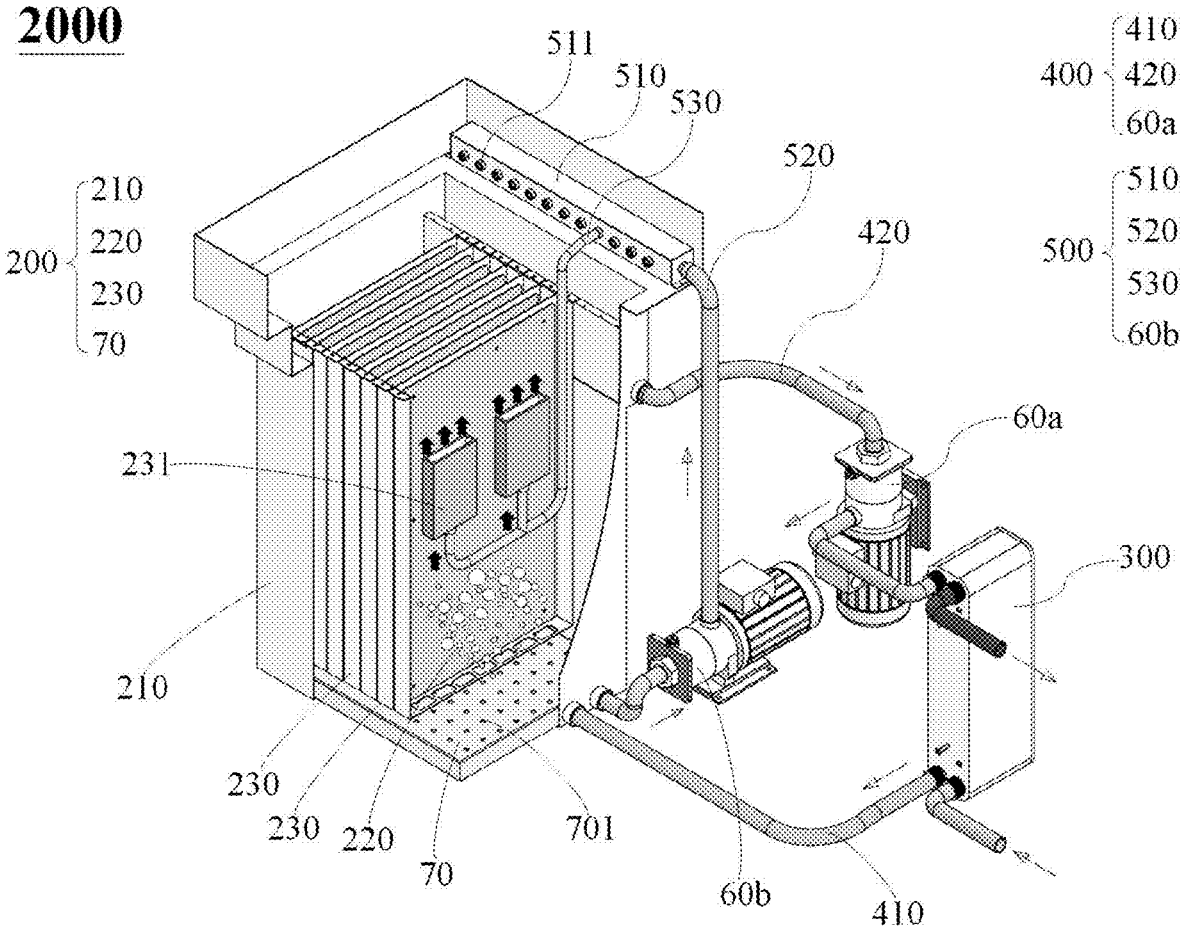
FIG. 3 is a schematic perspective view of a single phase liquid immersion cooling system with forced cooling circuit, according to one embodiment of the present disclosure.

Referring now to FIG. 2 and FIG. 3, which are respectively a block diagram and a schematic perspective view of the single phase liquid immersion cooling system with forced cooling circuit, according to one embodiment of the present disclosure. In this embodiment, a single phase liquid immersion cooling system with forced cooling circuit 2000 is provided mainly for cooling at least one heat-generating electronic device 230. The single phase liquid immersion cooling system with forced cooling circuit 2000 includes an immersion cooling unit 200, a heat exchanger 300, a first dielectric fluid-circulating unit 400, and a second dielectric fluid-circulating unit 500. Specifically, the immersion cooling unit 200 includes a tank 210 that defines a fluid-tight space within which dielectric fluid 220 is maintained. Moreover, the heat-generating electronic devices 230 are disposed in the fluid-tight space. For example, each of the heat-generating electronic devices 230 is a server and is provided with a plurality of heat-generating electronic components (hereafter as "heat-generating components") such as CPU, RAM module or HDD, etc. Also, the heat-generating electronic devices 230 are at least partially immersed within the dielectric fluid 220, and preferably are entirely immersed within the dielectric fluid 220. For more, each of the heat-generating electronic device 230 is provided with at least one radiator 231, wherein each of the radiators 231 is a finned cooler or a cold plate. Preferably, the radiator 231 is disposed on the CPU. In one embodiment of the present disclosure, the immersion cooling unit 200 further includes a guide board 70, wherein the guide board 70 is provided with through holes 701 thereon and is positioned between an inner-bottom surface of the tank 210 and the heat-generating electronic devices 230.

It is understood that the dielectric fluid 220 is a non-conductive coolant, which is known to ordinary people skilled in the art to which the present invention pertains.

Using the non-conductive coolant to cool servers can simplify the sealing structure of a cooling apparatus, and can also prevent the malfunction of servers. In a preferred embodiment, the non-conductive coolant is fluorine compound, fluorocarbon or hydrocarbon, etc. Those types of non-conductive coolant have a relatively high boiling point temperature ranging between 100° C. and 200° C., which is higher than peak operating temperatures of the heat-generating components, therefore the non-conductive coolant can remain in liquid phase. Besides, all non-conductive coolants with a boiling point temperature ranging between 100° C. and 200° C. can be used as the coolants in the present invention.

In one embodiment of the present disclosure, the first dielectric fluid-circulating unit 400 includes a first fluid inlet pipe 410, a first fluid outlet pipe 420, and at least one first motor pump 60*a*. The first fluid inlet pipe 410 interconnects the heat exchanger 300 and the tank 210. To be more specific, the first fluid inlet pipe 410 has one end connected to a lower-lateral wall of the tank 210 and positioned between the inner-bottom surface of the tank 21 and the guide board 70, and the first fluid inlet pipe 410 has the other end connected to the heat exchanger 300 (e.g. plate heat exchanger). The first fluid outlet pipe 420 interconnects the heat exchanger 300 and the tank 210. To be more specific, the first fluid outlet pipe 420 has one end connected to an upper-lateral wall of the tank 210 and positioned beneath a liquid level of the dielectric fluid 220, and the first fluid outlet pipe 420 has the other end connected to the heat exchanger 300 (e.g. plate heat exchanger). The at least one first motor pump 60*a* is disposed on the first fluid outlet pipe 420. The first fluid inlet pipe 410 is mainly used for guiding the dielectric fluid 220 cooled by the heat exchanger 300 into the tank 210, whereas the first fluid outlet pipe 420 is mainly used for guiding the dielectric fluid 220 flowing through the heat-generating electronic devices 230 into the heat exchanger 300 so as to cool the dielectric fluid 220.

In one embodiment of the present disclosure, the second dielectric fluid-circulating unit 500 includes a manifold 510, a second fluid outlet pipe 520, at least one second fluid inlet pipe 530, and at least one second motor pump 60*b*. The second fluid outlet pipe 520 interconnects the manifold 510 and the tank 210. More specifically, the second fluid outlet pipe 520 has one end connected to the manifold 510, and has the other end connected to the lower-lateral wall of the tank 210 and positioned between the inner-bottom surface of the tank 210 and the guide board 70. The second fluid outlet pipe 520 is provided with at least one second motor pump 60*b*. In one embodiment of the present disclosure, the number of the second fluid inlet pipe 530 is two, three or more than three. Each of the second fluid inlet pipes 530 interconnects the manifold 510 and the radiators 231. The manifold 510 is disposed on the upper-lateral wall of the tank 210, and above the heat-generating electronic devices 230. Furthermore, the manifold 510 is provided with at least one opening 511, wherein each of the openings 511 is positioned respectively in correspondence with each of the heat-generating electronic devices 230. To be specific, each second fluid inlet pipe 530 has one end connected to one of the openings 511 of the manifold 510, and has another two or more distal ends connected to the radiators 231 (e.g. finned coolers or cold plates). The second fluid outlet pipe 520 is mainly used for guiding the dielectric fluid 220 cooled by the heat exchanger 300 out of the tank 210 into the manifold 510, whereas the second fluid inlet pipe 530 is mainly used for guiding the dielectric fluid 220 from the manifold 510 into the radiators 231 (e.g. finned coolers or cold plates).

Figure 4:
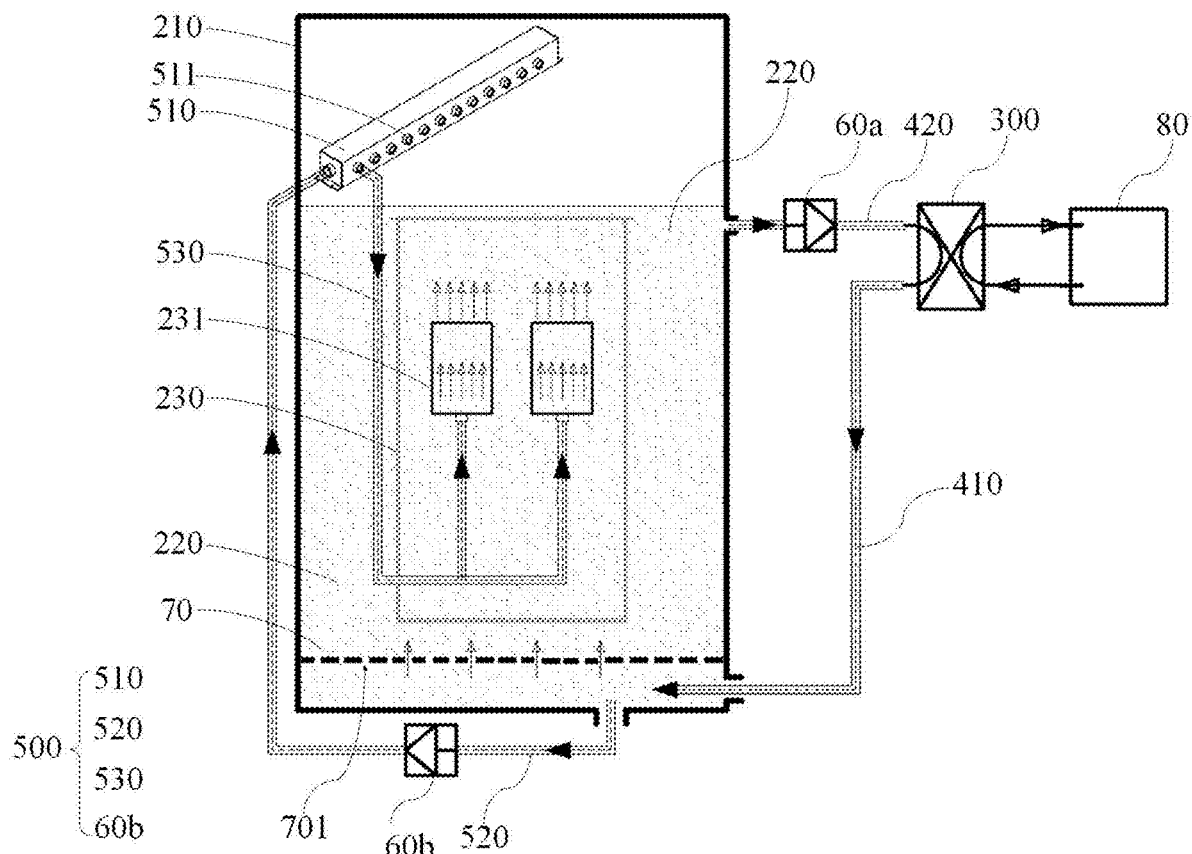
FIG. 4 is a schematic pipeline diagram of a single phase liquid immersion cooling system with forced cooling circuit, according to one embodiment of the present disclosure.

Next, turning now to FIG. 4, there is presented a schematic pipeline diagram of the single phase liquid immersion cooling system with forced cooling circuit, according to one embodiment of the present disclosure. In this embodiment, the tank 210 is provided with dielectric fluid 220 and at least one heat-generating electronic device 230 (e.g. one or more servers) therein, wherein the heat-generating electronic devices 230 are entirely immersed within the dielectric fluid 220. Each heat-generating electronic device 230 is provided with a plurality of heat-generating components (e.g. CPU, RAM module or HDD, etc.). Moreover, each heat-generating electronic device 230 is provided with at least one radiator 231 such as finned coolers or cold plates, wherein the radiators 231 are disposed on the CPUs in this embodiment.

As the heat-generating electronic device 230 starts to operate, the dielectric fluid 220 absorbs undesirable heat generated by the heat-generating components on the heat-generating electronic device 230. Upon absorption of the heat, volume of the heated dielectric fluid 220 increases and density decreases; therefore, the heated dielectric fluid 220 flows upwards. Then, the heated dielectric fluid 220 is forced out of the tank 20 by the first motor pump 60a. In this embodiment, one first motor pump 60a is disposed on the first fluid outlet pipe 420. In another preferable embodiment, two first motor pumps 60a are disposed on the first fluid outlet pipe 420. Alternatively, the first motor pump 60a is disposed on the first fluid inlet pipe 410. Specifically, the flow path of the dielectric fluid 220 is shown in FIG. 4: it flows from the first fluid outlet pipe 420 into the heat exchanger 300; meanwhile, a cooling tower 80 supplies working liquid coolant to the heat exchanger 300, and then the heated dielectric fluid 220 is in heat exchange with the working liquid coolant inside of the heat exchanger 300, whereby the heated dielectric fluid 220 is cooled by transferring the heat to the working liquid coolant; thereafter, the cooled dielectric fluid 220 flows back to the tank 210 through the first fluid inlet pipe 410, thereby forming a cooling circuit of the dielectric fluid. In certain embodiments, the heat exchanger 300 is connected to a common cooling tower 80, which supplies warm water having a temperature of 30° C.~35° C. as the working liquid coolant. In another embodiments, the heat exchanger 300 is connected to a cold water machine (not shown), which supplies cold water having a temperature of 6° C.~10° C. as the working liquid coolant.

It is worth mentioning that the tank 210 is provided with a guide board 70 at the inner bottom thereof, and the guide board 70 is positioned between the inner-bottom surface of the tank 210 and the heat-generating electronic device 230. The guide board 70 has a plurality of through holes 701 which can evenly distribute the cooled dielectric fluid 220 flowing back towards the heat-generating electronic device

230. Also, according to requirement in practical use, hole density of the through holes 701 may be partially adjusted in correspondence with position(s) of the heat-generating electronic device(s) 230.

Generally, the single phase liquid immersion cooling system is provided with multiple heat-generating electronic devices 230 therein, wherein different heat-generating components (e.g. CPU, RAM module or HDD, etc.) mounted on the heat-generating electronic devices 230 generate the undesirable heat at different rates; especially the CPU is the main source of the heat. Therefore, in order to cool the heat-generating electronic devices 230 and especially the main heat-generating components (e.g. CPUs) more effectively, a second dielectric fluid-circulating unit 500 is additionally disposed in the single phase liquid immersion cooling system. The second dielectric fluid-circulating unit 500 provides an actively forced cooling circuit of the dielectric fluid using the second motor pump 60b, thereby focusing on cooling each heat-generating electronic device 230 and particularly the main heat-generating components (e.g. CPUs). Specifically, the flow path of the dielectric fluid 220 in the actively forced cooling circuit is shown in FIG. 4: the cooled dielectric fluid 220 flows from the bottom of the tank 210 then into the manifold 510 through the second fluid outlet pipe 520, wherein the manifold 510 distributes the dielectric fluid 220 through each opening 511 into the respective second fluid inlet pipe 530, and then finally into the respective radiator 231 (e.g. a finned cooler or cold plate) disposed on each heat-generating electronic device 230. In this embodiment, the radiators 231 are disposed on the main heat-generating components (CPUs), thereby focusing mainly on cooling the CPUs. In other embodiments, the radiator(s) 231 is disposed on other heat-generating component(s) such as HDD, etc.

In one embodiment, the second fluid outlet pipe 520 is provided with one second motor pump 60b. In other preferable embodiments, the second fluid outlet pipe 520 is provided with two second motor pumps 60b, which are configured for forcing the dielectric fluid 220 out of the bottom of the tank 210 and then into the manifold 510. In addition, each second fluid inlet pipe 530 is preferably provided with a control valve (not shown), thereby adjusting the flow rate of the dielectric fluid 220 flowing from the manifold 510 into each second fluid inlet pipe 530. By such a physical configuration, it enables the fine-tuning of the flow rate of the dielectric fluid 220 flowing through each heat-generating electronic device 230 based on the amount of heat generated by different heat-generating components.

To demonstrate the cooling performance of the second dielectric fluid-circulating unit additionally disposed in the single phase liquid immersion cooling system according to the present disclosure, the Applicant conducted a conventional cooling performance test to provide experimental data in the following table:

| Second dielectric fluid-circulating unit (Actively forced cooling circuit) | Radiator (on CPU) | Flow rate of dielectric fluid (LPM) | Thermal resistance (° C./W) | Cooling capacity (W) | CPU Surface temperature (° C.) |
|---|---|---|---|---|---|
| None | Finned cooler | 8 (First dielectric fluid-circulating unit) | 0.12 | 350 | 82 |
| Applied | Finned cooler | 8 (First dielectric fluid-circulating unit) 5 (Second dielectric fluid-circulating unit) | 0.07 | 500 | 75 |

-continued

| Second dielectric fluid-circulating unit (Actively forced cooling circuit) | Radiator (on CPU) | Flow rate of dielectric fluid (LPM) | Thermal resistance (° C./W) | Cooling capacity (W) | CPU Surface temperature (° C.) |
| --- | --- | --- | --- | --- | --- |
| Applied | Cold plate | 8 ((First dielectric fluid-circulating unit) 3 (Second dielectric fluid-circulating unit) | 0.05 | 600 | 70 |

When the single phase liquid immersion cooling system is provided only with the first dielectric fluid-circulating unit, with parameters setting the temperature of the dielectric fluid in the tank at 40° C. and the flow rate of the dielectric fluid flowing through the finned cooler on the CPU at 8 LPM (liter per minute), the cooling performance on the CPU is measured as having a thermal resistance of 0.12° C./W, a heat dissipation capacity of 350 W, and a surface temperature of the CPU of about 82° C. In the other hand, when the single phase liquid immersion cooling system is provided additionally with the second dielectric fluid-circulating unit, with parameters setting the temperature of the dielectric fluid in the tank at 40° C. and the forced flow rate of the dielectric fluid flowing through the finned cooler on the CPU at 5 LPM, the cooling performance on the CPU is measured as having a thermal resistance of 0.07° C./W, a heat dissipation capacity of 500 W, and a surface temperature of the CPU of about 75° C. Moreover, when the forced flow rate of the dielectric fluid flowing through the cold plate on the CPU is set at 3 LPM, the cooling performance on the CPU is measured as having a thermal resistance of 0.05° C./W, a heat dissipation capacity of 600 W, and a surface temperature of the CPU of about 70° C.

Based on the test results shown above, it can be understood that in comparison with the conventional single phase liquid immersion cooling system where only the first dielectric fluid-circulating unit is provided, applying an additional second dielectric fluid-circulating unit in the single phase liquid immersion cooling system can force an active flow of the dielectric fluid onto the main heat-generating components (e.g. CPUs), thereby achieving lower thermal resistance and better cooling performance.

According to the abovementioned technique, the present disclosure has the following advantages compared to the conventional technique:

1. The present single phase liquid immersion cooling system is provided with an additional second dielectric fluid-circulating unit, wherein the second dielectric fluid-circulating unit forces an active flow of the dielectric fluid onto the heat-generating electronic device(s), thereby achieving higher heat exchange efficiency.

2. The second dielectric fluid-circulating unit of the present disclosure enables the fine-tuning of the flow rate of the dielectric fluid flowing through the radiators disposed on each heat-generating electronic device based on the amount of heat generated by different heat-generating components (e.g. CPU or HDD, etc.), thereby locally adjusting the heat exchange of the electronic device with the dielectric fluid.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims.

What is claimed is:

1. A single phase liquid immersion cooling system with a forced cooling circuit for cooling at least one heat-generating electronic device, comprising:

an immersion cooling unit including a tank defining a fluid-tight space within which a dielectric fluid is maintained, wherein the at least one heat-generating electronic device is disposed within the fluid-tight space and at least partially submerged within the dielectric fluid, and the at least one heat-generating electronic device is provided with at least one radiator;

a heat exchanger;

a first dielectric fluid-circulating unit including:

a first fluid inlet pipe interconnecting the heat exchanger and the tank for guiding the dielectric fluid cooled by the heat exchanger into the tank, a first fluid outlet pipe interconnecting the heat exchanger and the tank for guiding the dielectric fluid flowing through the at least one heat-generating electronic device into the heat exchanger so as to cool the dielectric fluid, and at least one first motor pump disposed on the first fluid outlet pipe; and a second dielectric fluid-circulating unit including:

a manifold, a second fluid outlet pipe interconnecting the manifold and the tank for guiding the dielectric fluid cooled by the heat exchanger out of the tank into the manifold, at least one second fluid inlet pipe interconnecting the manifold and the at least one radiator for guiding the dielectric fluid from the manifold into the at least one radiator, and at least one second motor pump disposed on the second fluid outlet pipe;

wherein the immersion cooling unit further includes a guide board provided with a plurality of through holes, and the guide board is disposed between an inner-bottom surface of the tank and the at least one heat-generating electronic device; the second fluid outlet pipe has an end connected to a lower-lateral wall of the tank and positioned between the inner-bottom surface of the tank and the guide board.

2. The single phase liquid immersion cooling system according to claim 1, wherein the at least one radiator is a finned cooler or a cold plate.

3. The single phase liquid immersion cooling system according to claim 1, wherein the heat exchanger is a plate heat exchanger.

4. The single phase liquid immersion cooling system according to claim 1, wherein the manifold is disposed on an inner upper-lateral wall of the tank and above the at least one heat-generating electronic device, and the manifold is provided with at least one opening that is positioned in correspondence with the at least one heat-generating electronic device.

5. The single phase liquid immersion cooling system according to claim 1, wherein the first fluid inlet pipe has an end connected to the lower-lateral wall of the tank and positioned between the inner-bottom surface of the tank and the guide board; and the first fluid outlet pipe has an end connected to an upper-lateral wall of the tank and positioned beneath a liquid level of the dielectric fluid.

\* \* \* \* \*